United States Patent [19]

Alsmeier et al.

[11] Patent Number: 5,559,050
[45] Date of Patent: Sep. 24, 1996

[54] P-MOSFETS WITH ENHANCED ANOMALOUS NARROW CHANNEL EFFECT

[75] Inventors: Johann Alsmeier, Wappingers Falls, N.Y.; Wayne F. Ellis, Jericho, Vt.; Jack A. Mandelman, Stormville, N.Y.; Hing Wong, Norwalk, Conn.

[73] Assignee: International Business Machines Corporation, Armonk, N.Y.

[21] Appl. No.: 269,857

[22] Filed: Jun. 30, 1994

[51] Int. Cl.$^6$ ................................................ H01L 21/265
[52] U.S. Cl. ........................................................ 437/45
[58] Field of Search .................................................. 437/45

[56] References Cited

U.S. PATENT DOCUMENTS

| | | | |
|---|---|---|---|
| 4,596,068 | 6/1986 | Peters, Jr. | 437/45 |
| 5,073,512 | 12/1991 | Yoshino | 437/45 |
| 5,208,171 | 5/1993 | Ohmi | 437/45 |
| 5,270,235 | 12/1993 | Ito | 437/45 |
| 5,320,975 | 6/1994 | Cederbaum et al. | 437/44 |
| 5,359,221 | 10/1994 | Miyamoto et al. | 257/408 |
| 5,395,773 | 3/1995 | Ravindhran et al. | 437/41 |

FOREIGN PATENT DOCUMENTS

| | | | |
|---|---|---|---|
| 0399066 | 11/1990 | European Pat. Off. | H01L 21/76 |
| 60-258958 | 12/1985 | Japan | H01L 27/14 |
| 62-239567 | 10/1987 | Japan | H01L 27/08 |
| 2-275645 | 11/1990 | Japan | H01L 21/339 |

OTHER PUBLICATIONS

Mandelman, J. A., et al., "Anomalous Narrow Channel Effect in Trench–Isolated Buried–Channel P–MOSFET's", IEEE Electron Device Letters, Dec. 1994, vol. 15, No. 12, pp. 496–498.

Coppee, J. L., et al., "Narrow Channel Efect on n– and p–Channel Devices Fabricated with the Silo and Box Isolation Techniques", 18th European Solid State Device Research Conference, Montpellier, France, 13–16 Sep. 1988, Journal De Physique Colloque, vol. 49, No. C–4, pp. 749–752.

Primary Examiner—Mary Wilczewski
Assistant Examiner—Brian K. Dutton

[57] ABSTRACT

An anomalous threshold voltage dependence on channel width measured on 0.25 μm ground rule generation trench-isolated buried-channel p-MOSFETs is used to enhance circuit performance. As the channel width is reduced, the magnitude of the threshold voltage first decreases before the onset of the expected sharp rise in $V_t$ for widths narrower than 0.4 μm. Modeling shows that a "boron puddle" is created near the trench bounded edge as a result of transient enhanced diffusion (TED) during the gate oxidation step, which imposes a penalty on the off-current of narrow devices. TED is governed by interstitials produced by a deep phosphorus implant, used for latchup suppression, diffusing towards the trench sidewall and top surface of the device.

7 Claims, 3 Drawing Sheets

ANOMALOUS PFET NARROW CHANNEL EFFECT

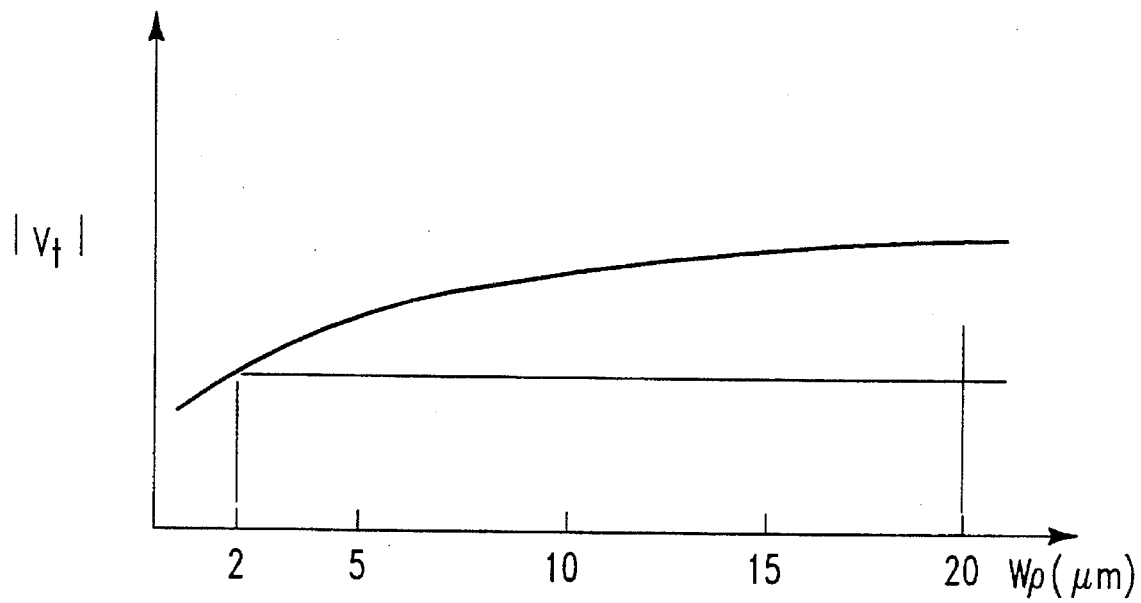
FIG. 2 ANOMALOUS PFET NARROW CHANNEL EFFECT
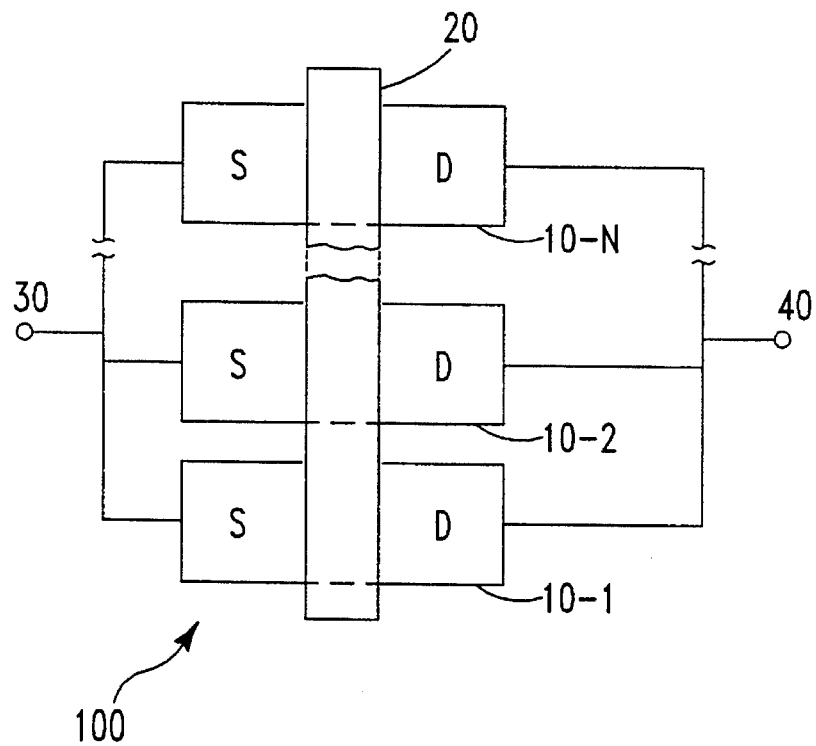
FIG. 4

P-MOSFETS WITH ENHANCED ANOMALOUS NARROW CHANNEL EFFECT

TECHNICAL FIELD

The field of the invention is that of buried channel p-FET integrated circuit processing in which the transistors are isolated by trenches and in which the ground rules are in the range of about 0.25 μm.

BACKGROUND OF THE INVENTION.

It has been known that corner conduction in trench isolated n-MOSFETs may be a significant contributor to standby current in low standby power ULSI applications, as described in A. Bryant, et al "The current-carrying corner inherent to trench isolation", IEEE Electron Device Letters, vol 14, no. 8, pp. 412–414, 1993 and B. Davari, et al "A variable-size shallow trench isolation (STI) technology with diffused sidewall doping for submicron CMOS" 1988 IEDM Technical Digest, pp. 92–95, 1988. A manifestation of corner conduction is inverse narrow channel effect when the standard current definition of $V_t$ ($I_{vt}$=40× ($W_{des}/L_{des}$)nA) is applied. However, corner conduction in buried-channel p-MOSFETs has not, heretofore, been recognized as a concern. In buried-channel p-MOSFETs, the polarity of the work function difference between the N+ poly gate and the buried p-layer depletes the buried layer of carriers at low gate voltages. Due to the geometrically enhanced field at the silicon corner, it is expected that, when the doping is uniform across the device width, the magnitude of $V_t$ (the threshold voltage) at the corners of these devices is greater than at mid-channel. This leads to a normal narrow channel effect.

SUMMARY OF THE INVENTION

The invention relates to a CMOS integrated circuit in which a performance advantage for p-FETS is achieved by use of an anomalous narrow channel effect.

A feature of the invention is the use of wide transistors having a $V_t$ chosen to meet off-current design objectives together with narrow transistors having a reduced $V_t$ for improved performance.

Another feature of the invention is the use of improved performance high-current transistors comprising a number of narrow transistors connected in parallel.

BRIEF DESCRIPTION OF THE DRAWING

FIG. 2 illustrates the dependence of $V_t$ on channel width for buried-channel p-FET having channel widths in the range of 2–20 μm.

FIG. 4 illustrates a high-current low $V_t$ transistor set according to the invention.

BEST MODE OF CARRYING OUT THE INVENTION

Figure 1:
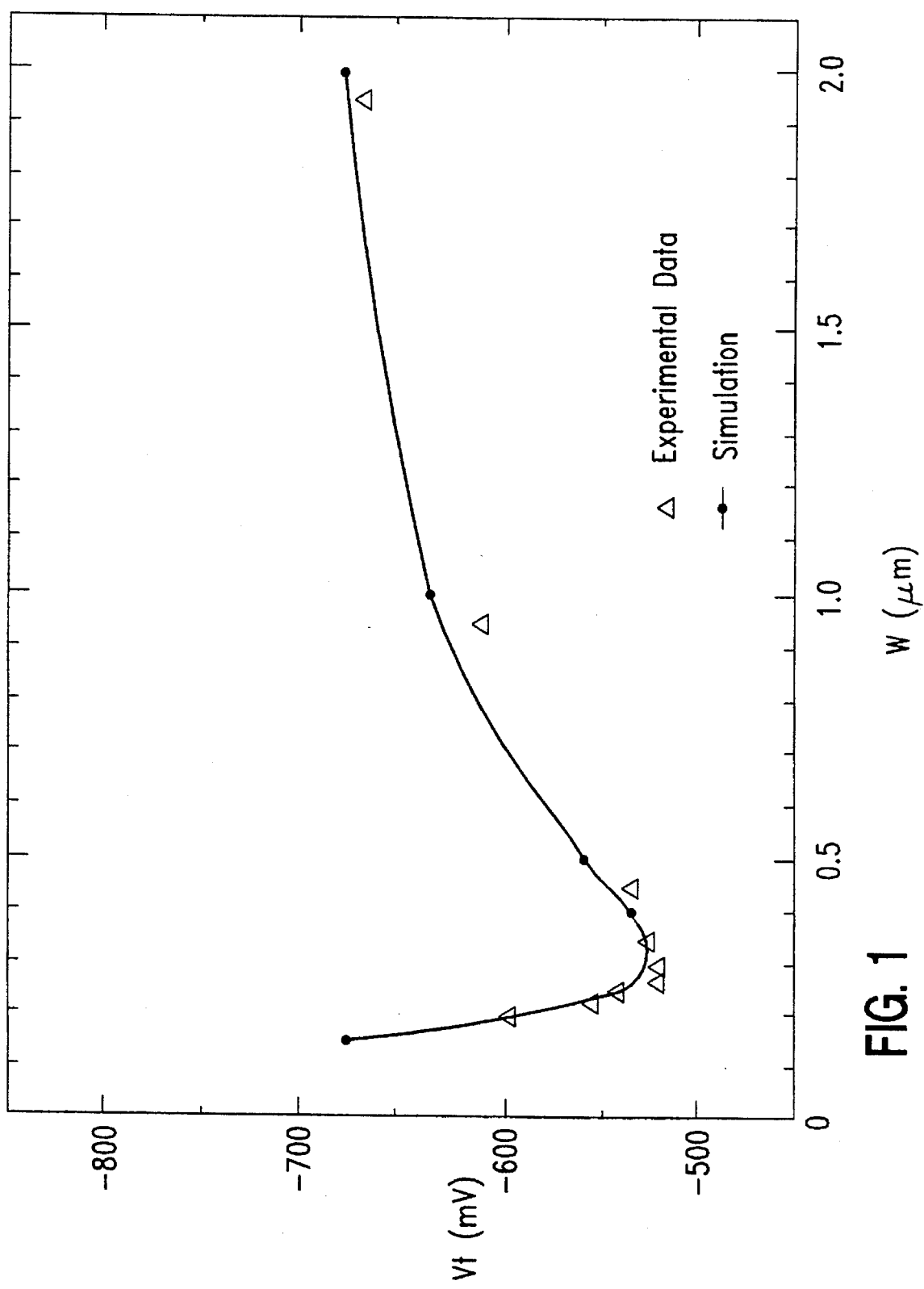
FIG. 1 illustrates measured and predicted values of $V_t$ for different buried-channel transistor widths.

An anomalous narrow channel behavior has been observed on buried-channel p-MOSFETs based on a 0.25 μm CMOS process. The magnitude of the threshold voltage decreases when going from very wide devices to approximately 0.4 μm width (referred to as the inverse narrow channel effect). For devices narrower than 0.4 μm, the expected normal narrow channel effect is observed as described in K. Ohe, et al "Narrow-width effects of shallow trench-isolated CMOS with n+ polysilicon gate", IEEE Trans. Electron Devices, vol. 36, no. 6, pp. 1110–1116, 1989. FIG. 1 shows the relationship between $V_t$ and channel width for buried-channel p-FETs having gate oxide thickness of about 10 nm and $V_{DS}$ of 0.1 V. These characteristics are also typical of transistors of shorter channel length and higher drain-source voltage.

FIG. 2 illustrates the relationship for a wider range of channel width. If the buried-channel boron dose is decreased to assure that the off current is less than or equal to the design objective off current over the entire range of design widths, as would be consistent with the prior art, the performance of the widest devices is compromised as a result of higher than desired $V_t$. A loss of overdrive of 100 mv on the widest devices is typical.

A performance advantage based on the anomalous narrow channel effect can be realized by using relatively narrow (2–10 μm) devices for the logic circuitry and wide (>20 μm) devices for the inverters that drive large loads by setting the $V_t$ of the widest devices to meet the off-current objective, which permits a reduction in the magnitude of $V_t$ for the narrower devices, thus giving improved performance. As is known, the $V_t$ for the devices is initially set by the buried channel implant, conventionally done after the deep (or latchup) implant. The deep implant then raises $V_t$ for the wider devices. Since most of the standby current is contributed by the wide devices, this approach has little effect on total standby current.

It has been found that the anomalous narrow channel effect results from a "boron puddle" or localized increase in the boron concentration near the edge of the isolation trenches created by transient enhanced diffusion (TED) of the boron in the buried layer. The TED, in turn, results from an excess interstitial (described in "Point Defects and Diffusion in Silicon", P. M. Fahey, et al Reviews of Modern Physics, vol 61, no. 2, April 1989) distribution arising from damage caused by the 2.5×10^13/cm2, 500 keV phosphorous implant used for latchup suppression, in conjunction with strong excess interstitial recombination on the top surface and trench sidewalls of the device.

The performance improvement due to the anomalous narrow channel effect has been modelled using Simulation Program With Integrated Circuit Emphasis, SPICE and it has been found that, for a typical delta $V_t$ of 100 mV between devices having p-channel width $W_p$ of Wp=2 μm and Wp=20 μm, there is a performance improvement of 4.7% using NAND logic. If the delta $V_t$ is increased to 200 mV by enhancing the anomalous narrow channel effect, the performance improvement increases to 9.3%. Even greater performance improvements can be obtained using NOR logic, without any increase in standby current.

The anomalous narrow channel effect can be enhanced by increasing the implanted point defect concentration. These point defects provide the source of the excess interstitials that drive the formation of the boron puddle and therefore the anomalous narrow channel effect. One method of enhancement is that of increasing the dose of the deep phosphorous implant. Such an increase does not have an effect on device operation because the dopant provided by this implant is too deep (~0.8 μm) to affect the device. Indeed, the increase in dopant also improves latchup suppression. Doubling the deep implant dose at the same energy is shown in simulations to increase the delta $V_t$ (between Wp=2 to 20 μm) from 100 mV to 200 mV.

For purposes of this disclosure, the term "latchup dose" will be taken to mean an implant of $2.5\times10^{13}/cm^2$ at an energy of 500 keV and the term "latchup-threshold dose" will be taken to mean a dose greater than $4\times10^{13}/cm^2$ at an energy of greater than 500 keV. The term "p-sites" will be taken to mean the locations in a wafer where p-FETs will be formed. Also, the terms "narrow" and "wide" when applied to the p-FET channel width will be taken to mean less than about 10 μm and greater than about 10 μm, respectively.

In addition, the energy of the deep implant can be increased (illustratively to 1 MeV) for even greater enhancement by increasing the crystal damage caused by the implant. Additionally, the use of higher implant energies moves the tail far enough from the surface that even greater doses can be used without affecting the device doping. Implanting other species such as silicon or any other species that is not electrically active can also be used to increase the anomalous narrow channel effect without affecting the latchup effect of the deep implant.

If, on the other hand, it is desired to reduce the anomalous narrow channel effect, the addition of an annealing step between the deep implantation and the gate growth of the oxide of 60 minutes at 800° C. provides for rapid excess interstitial recombination on the Si/SiO2 interfaces, which greatly reduces the TED of boron during the 850° C. gate oxidation. Alternatively, the gate oxide (illustratively about 10 nm) may be formed at a higher temperature such as 1050° C. for a correspondingly shorter time that reduces the TED.

In a conventional process, a 15 minute, 850° C. dry gate oxidation immediately follows the n-well and boron buried-channel implants. An 800° C. 60 minute anneal immediately following the deep phosphorus implant and prior to the gate oxidation results in rapid excess interstitial recombination on the Si/SiO2 interfaces. Thus, TED of boron is greatly reduced during the subsequent 850° C. gate oxidation. Measurements and simulation confirm that the "boron puddle" and anomalous narrow channel effect are greatly reduced (net p-type concentration peaks only 3% above mid-width value for a device width of 2 μm). The boron diffusivity at the depth of maximum boron concentration (~30 nm) increases and the boron distribution broadens from trench edge toward the middle of the area between the trenches (the active area). The minimum in the peak net p-type concentration of the buried layer occurs at mid-width and is accentuated by the compensation of boron by the n-well doping. Furthermore, the gradient in the excess interstitial concentration drives the boron towards the trench edge. Within approximately 30 nm of the trench edge, segregation induced boron depletion and n-type dopant pile-up reduce the net p-type concentration.

Figure 3:
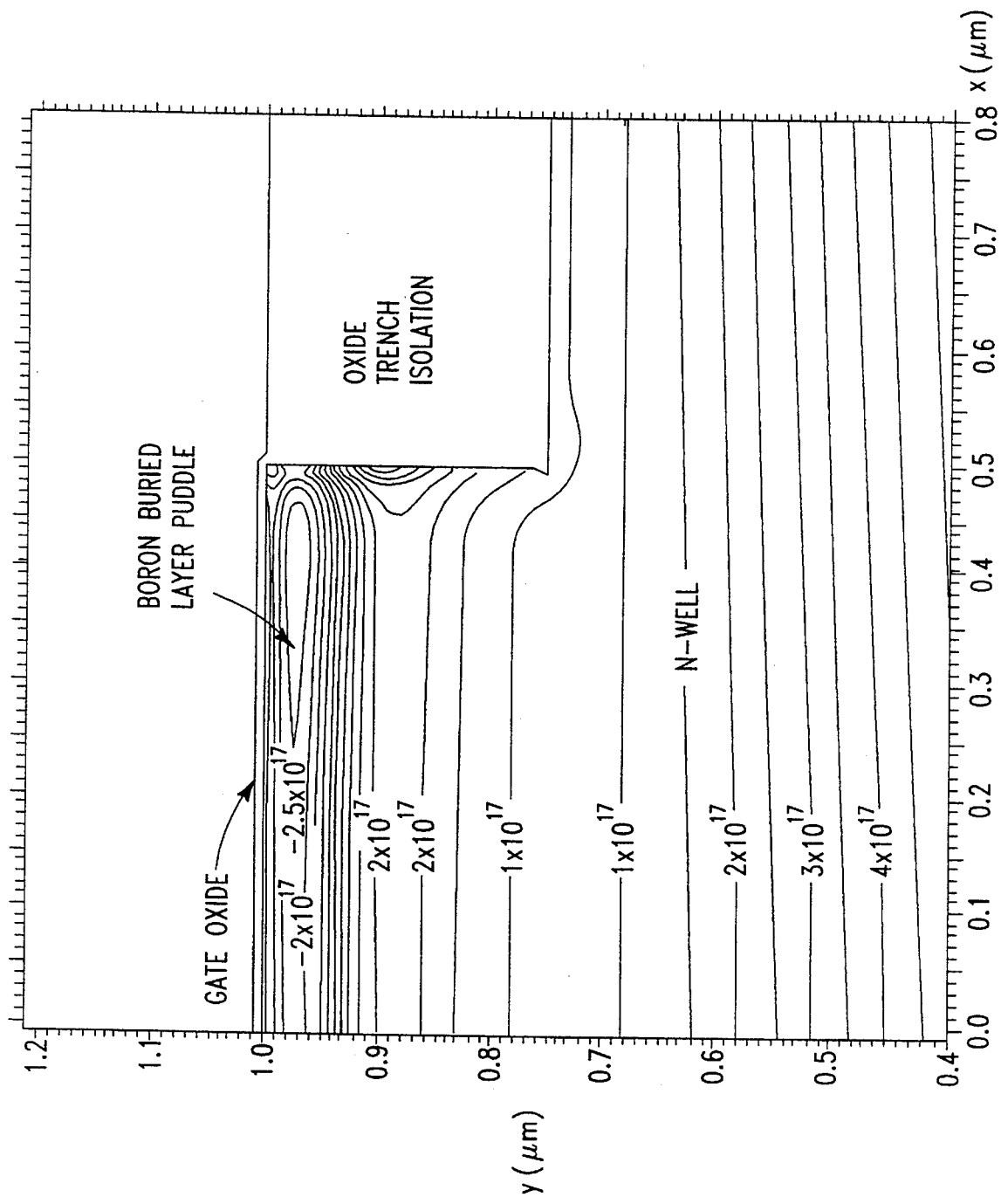
FIG. 3 illustrates the distribution of Boron concentration in a buried-channel p-FET.

The overall effect of the excess interstitial distribution on the diffusion of boron during the 850° C. gate oxidation is the creation of a "boron puddle" near the trench edge, as shown by the simulated net doping distribution at end of process in FIG. 3 for a channel width of about 0.9 μm.

Modeling shows that the peak net p-type concentration in the "boron puddle" is approximately 32% greater than at mid-width, for a 2 μm wide device. As the device width is reduced down to approximately 0.4 μm, the peak net p-type concentration increases because of decreased interstitial concentration at the top surface resulting from recombination on the trench sidewall. For still narrower devices the effect of the n-type dopant pileup on the trench sidewall reduces the buried layer concentration. FIG. 3 shows measured $V_t$ vs W characteristics compared with simulated results obtained from TSUPREM-4 and FIELDAY. It is noteworthy that evidence of a comparable boron puddle for the complementary n-MOSFET is neither observed experimentally, nor predicted by modeling. The use of the extra anneal results in a drastically reduced "boron puddle" and also results in a lower magnitude of wide device $V_t$, since reduced TED of boron leaves a higher peak net p-type concentration in the buried layer.

In addition to setting the deep implant parameters to provide low leakage for wide devices and enhanced performance for logic devices, it is also possible to take advantage of the dependence of $V_t$ on width to provide for low $V_t$ where it is needed for high-current applications by connecting a number of narrow channel devices in parallel to provide the desired total current. FIG. 4 illustrates in partially schematic, partially pictorial form a set of transistors denoted generally with the numeral 100 having a source node 30, a drain node 40 and a common gate 20. Each of the N transistors in the set 10-1 to 10-N has a channel width Wn chosen to provided the desired $V_t$. The total number N is chosen to provide the required current for the application in question.

Those skilled in the art are well aware that there are many steps in an integrated circuit process. For convenience in terminology, the phrase "preparing the substrate" will be used to indicate conventional steps such as growing an epitaxial layer (where used), performing a threshold implant, cutting and filling trenches for isolation, forming p-and n-wells etc. Similarly, the phrase "completing the circuit" will be used to indicate the remaining steps after the deep implant such as completing the transistors p-FET and/or n-FETs and forming the interconnections, etc.

Those skilled in the art will readily be able to devise additional embodiments in the light of this disclosure and the following claims are not intended to be limited to the embodiments illustrated.

We claim:

1. A method of forming an integrated circuit having buried channel p-FETs, having p-FET gates, formed in p-sites in a substrate and isolated by trench isolation comprising the steps of:

preparing said substrate;

performing a latchup implant in at least some of said p-sites below said p-FETs to suppress latchup in said p-FETs, said latchup implant having a latchup dose and latchup energy;

thereafter forming said p-FETs, including said p-FET gates, above said p-sites including performing a buried channel implant to set a logic threshold voltage; and completing said circuit, characterized in that: said latchup dose and said latchup energy of said latchup implant is set to provide a delta threshold voltage for those p-FETs having a channel width greater than 10 μm relative to said logic threshold voltage set by said buried channel implant for those p-FETs, whereby p-FETs having a channel width of 2 μm to 10 μm in the circuit have different threshold voltages dependent on their channel width.

2. A method according to claim 1, further characterized in that said latchup dose is greater than $2.5\times10^{13}/cm^2$.

3. A method according to claim 1, further characterized in that said latchup energy is greater than 500 keV.

4. A method according to claim 2, further characterized in that said latchup energy is greater than 500 keV.

5. A method of forming an integrated circuit having buried channel p-FETs, having p-FET gates, formed in p-sites in a substrate and isolated by trench isolation comprising the steps of:

preparing said substrate;

performing a latchup implant in at least some of said p-sites below said p-FETs to suppress latchup in said p-FETs, said latchup implant having a latchup concentration and latchup energy;

thereafter forming said p-FETs, including said p-FET gates, above said p-sites; and completing said circuit, characterized in that:

said step of performing a latchup implant is followed by a step of annealing crystal damage before a step of gate oxide growth, whereby transient enhanced diffusion is reduced and the threshold voltage of p-FETs having various channel widths is made more uniform.

6. A method of forming an integrated circuit having buried channel p-FETs, having p-FET gates, formed in p-sites in a substrate and isolated by trench isolation comprising the steps of:

preparing said substrate;

performing a latchup implant in at least some of said p-sites below said p-FETs to suppress latchup in said p-FETs, said latchup implant having a latchup concentration and latchup energy;

thereafter forming said p-FETs, including said p-FET gates, above said p-sites; and completing said circuit, characterized in that:

said step of performing a latchup implant is followed by a step of growing a gate oxide at a temperature greater than 1,000° C., whereby transient enhanced diffusion is reduced and the threshold voltage of p-FETs having various channel widths is made more uniform.

7. A method of forming an integrated circuit having buried channel p-FETs, having p-FET gates, formed in p-sites in a substrate and isolated by trench isolation comprising the steps of:

preparing said substrate;

performing a latchup implant in at least some of said p-sites below said p-FETs to suppress latchup in said p-FETs, said latchup implant having a latchup concentration and latchup energy;

thereafter forming said p-FETs, including said p-FET gates, above said p-sites; and completing said circuit, characterized in that: said latchup concentration and said latchup energy of said latchup implant is set to provide a first threshold voltage for a p-FET having a channel width greater than 10 µm, thereby providing a logic threshold voltage less than said first threshold voltage for those p-FETs having a channel width of 2 µm to 10 µm, whereby p-FETs in said circuit have different threshold voltages dependent on their channel width and connecting at least one set of transistors in parallel, said set of transistors having a common channel width corresponding to a set threshold voltage less than said first threshold voltage, whereby said set of transistors passes a set current greater than an individual current characteristic of a member of said set of transistors, and also has a threshold voltage less than said first threshold voltage.

* * * * *